(12) United States Patent
Komatsu et al.

(10) Patent No.: US 7,516,059 B2
(45) Date of Patent: Apr. 7, 2009

(54) LOGICAL SIMULATION DEVICE

(75) Inventors: Hiroaki Komatsu, Kawasaki (JP); Hirofumi Hamamura, Tokyo (JP)

(73) Assignee: Fujitsu Limited, Kawasaki (JP)

( * ) Notice: Subject to any disclaimer, the term of this patent is extended or adjusted under 35 U.S.C. 154(b) by 451 days.

(21) Appl. No.: 11/166,156

(22) Filed: Jun. 27, 2005

(65) Prior Publication Data
US 2005/0240388 A1    Oct. 27, 2005

Related U.S. Application Data

(63) Continuation of application No. PCT/JP02/13823, filed on Dec. 27, 2002.

(51) Int. Cl.
*G06F 17/50* (2006.01)
(52) U.S. Cl. ........................................ 703/14
(58) Field of Classification Search ............. 703/13–15, 703/22
See application file for complete search history.

(56) References Cited

U.S. PATENT DOCUMENTS 5,093,920 A    3/1992    Agrawal et al.

FOREIGN PATENT DOCUMENTS

| JP | 64-26969 | 1/1989 |
|---|---|---|
| JP | 7-200508 | 8/1992 |
| JP | 2000-36737 | 2/2000 |

OTHER PUBLICATIONS

Nobuhiko Koike, "CAD Machine", The Institute of Electronics, Information and Communication Engineers, Ohmusha, Ltd., Dec. 25, 1989, pp. 9, 1.8—pp. 12, pp. 34-39, 1.25, pp. 43-50, 1.16.
Andrew Flavell, et al., "MANDALA: An Interconnection Network for a Massively Parallel Computer", IPSJ SIG Notes, Information Processing Society of Japan, vol. 91, No. 100, Nov. 22, 1991, pp. 101-109.
Japanese Decision of Rejection, dated Sep. 5, 2006, and issued in priority Japanese Patent Application No. 2004-564447.
Nobuhiko Koike, "CAD Machine", (A book of the Computer Architecture Series edited by IEICE), Ohmusha, Ltd., Dec. 25, 1989, pp. 10-12, 17-20, 34-39 and 43-51.
Notice of Rejection Grounds for corresponding Japanese Application No. 2004/564447 dated Jun. 9, 2006.

*Primary Examiner*—Russell Frejd
(74) *Attorney, Agent, or Firm*—Staas & Halsey LLP

(57) ABSTRACT

A logical simulation device executes simulation, based on cycle, using level sort and compile methods. In order to realize the high speed of the entire system in a practically usable scale, the system comprises a lot of processors, each capable of performing an evaluation process of executing simulation using a logical block corresponding to one or more gates as an evaluation unit, and a communication process with the other processors. A plurality of processors constitute a processor group, and a plurality of processor groups are connected to each other to form a tree-shaped hierarchy.

9 Claims, 15 Drawing Sheets

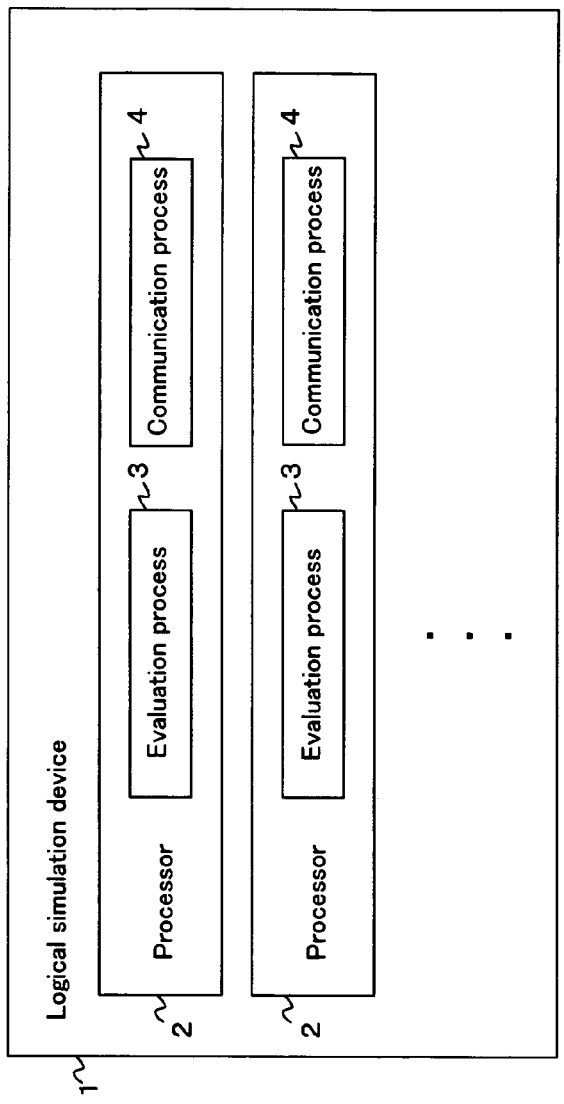
F I G. 1

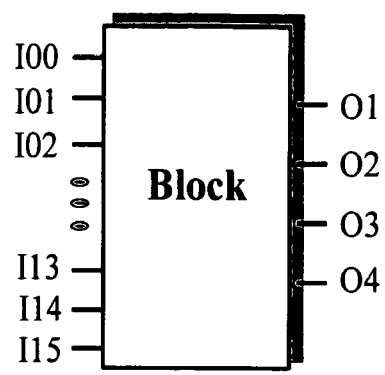
F I G. 6

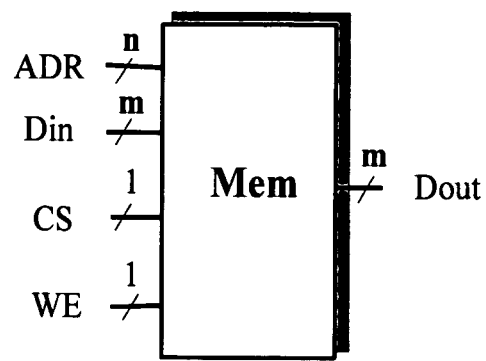
F I G. 7

| Instruction | Function |
|---|---|
| nop | Suppress writing into SR, increment PC after 1 UC. |
| next | Increment PC after a specified MC. |
| waits | Wait for a start signal. |
| wait | Increment PC after a specified UC. |
| jump | Set PC after a specified address. |
| jumpc | Set PC to an address specified when monitor Conditions are met. |

F I G. 10

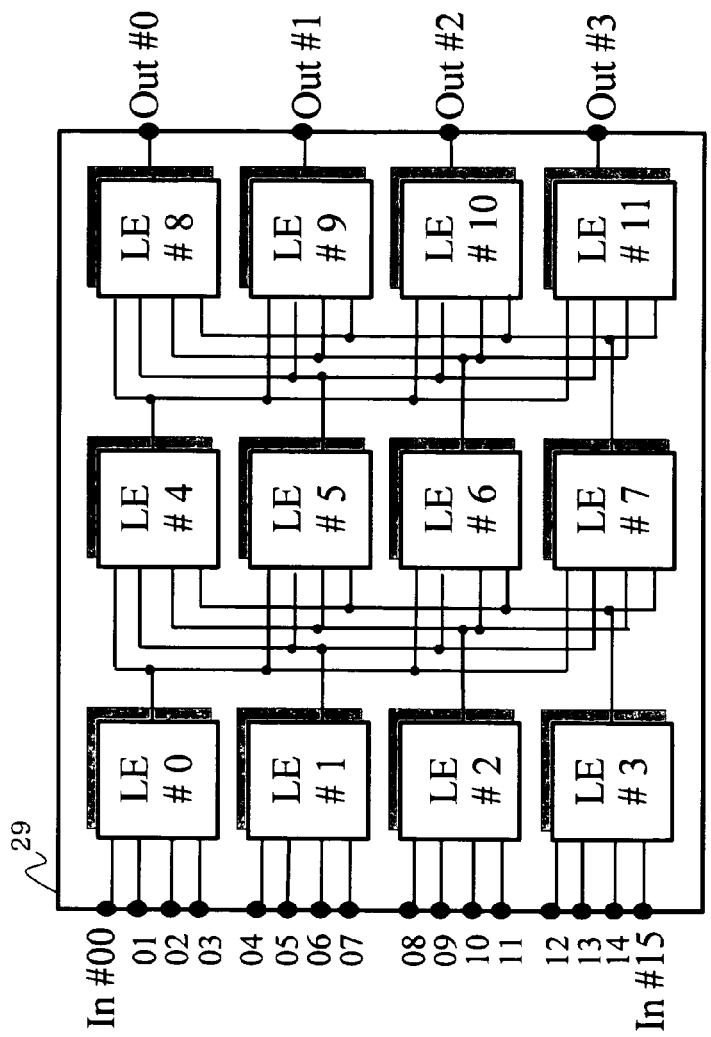
F I G. 11

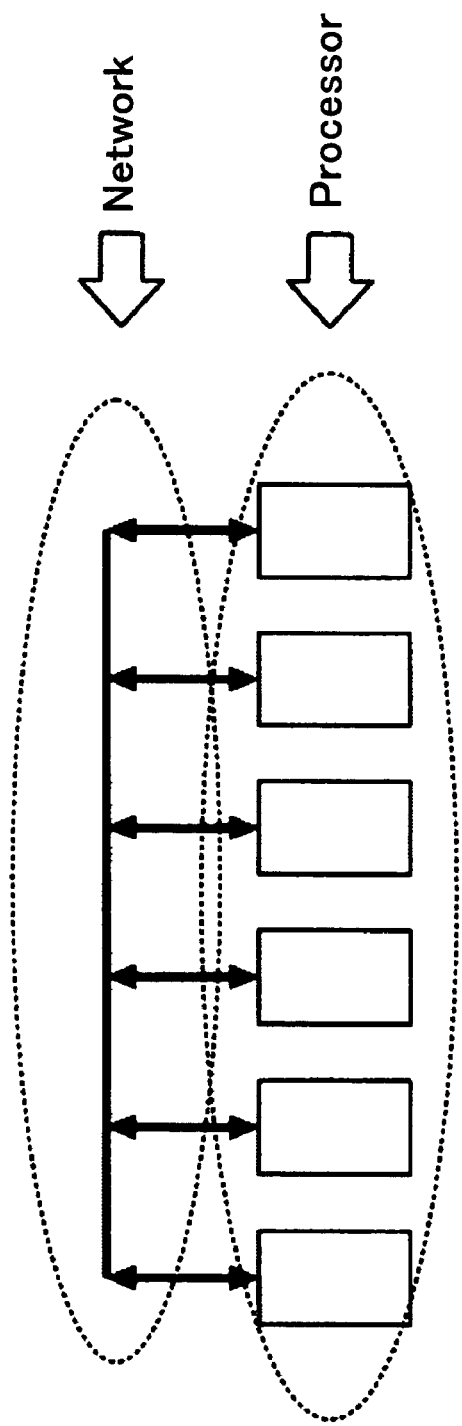
F I G. 14

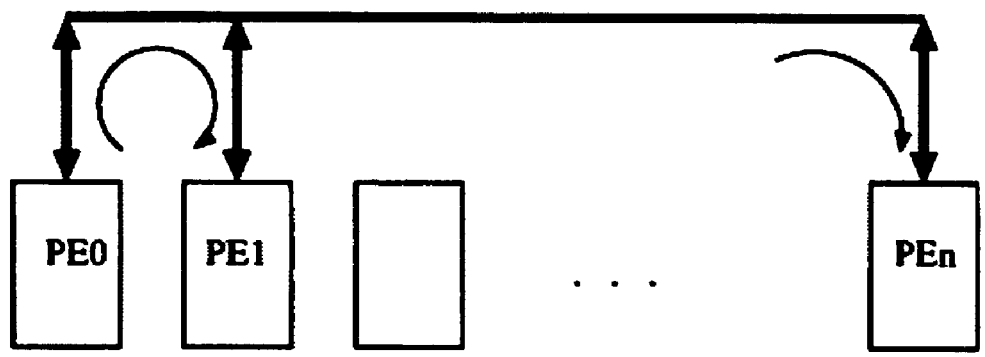
F I G. 15

LOGICAL SIMULATION DEVICE

CROSS REFERENCE TO RELATED APPLICATION

This application is a continuation of international PCT application No. PCT/JP2002/013823 filed on Dec. 27, 2002.

BACKGROUND OF THE INVENTION

1. Field of the Invention

The present invention relates to the simulation method of a large-scale logical circuit, and more particularly to a distribution type super-parallel processor method cycle-based logical simulation device for executing the high-speed simulation of a large-scale digital circuit with several ten million or more gates at a logical block level.

2. Description of the Related Art

Recently, with the rapid progress of a complementary metal-oxide semiconductor large-scale integration (CMOS LSI) technology, the improvement in performance and function of digital system equipment has been promoted. How early high-quality design is realized and a new product is marketed in a state where the reduction of a product development period is promoted is the most important problem in new product development. To solve this problem, a large-capacity and high-speed simulation device for efficiently performing the logical verification of a large-scale system circuit is strongly demanded.

In such a situation, exclusive hardware has been studied and developed in order to improve logical simulation performance. These exclusive hardware realizing methods are basically classified into a processor method and a field programmable gate array (FPGA) method.

In the processor method, a circuit model is converted into a processor instruction and a simulation algorithm is executed. Compared with the FPGA method for simulating an actual hardware circuit, although its process speed is low, the set-up time of the circuit model is short. Therefore, by increasing the number of processors, its performance can be improved and its capacity can be increased.

In the FPGA method, since a circuit operation can be directly simulated by mapping a circuit model, high-speed processing can be realized. However, it is difficult to increase capacity for the reason that the number of operating frequencies decreases as circuit scale increases.

Basically processor method simulation-exclusive hardware is largely classified into a level sort method and an event method.

In the level sort method, a level number is assigned according to the number of steps after the external input terminal or storage device of a circuit to which logical verification is applied, and simulation is sequentially executed according to the level number. By executing simulation, calculation is conducted for all gates, regardless of the change in output of a gate corresponding to this level number.

In the event method, the output of a gate is evaluated in accordance with the event, event-driven, that is, by using the change of an input signal as event. If the output changes, the change is propagated in the circuit as event, and gate calculation is sequentially made.

Exclusive hardware for executing simulation at a logical block level, based on an algorithm obtained by combining the level sort method and level method is announced. However, the present invention targets a logical simulation device adopting the level sort method. Since any exclusive hardware based on such a level sort method cannot handle delay time, this is a cycle-based type simulator targeting a synchronous circuit.

Concerning the above-mentioned logical simulation device and a super-parallel processor combination method, there are the following reference literatures.

Patent Reference 1:
Japanese Patent Application No. 2000-36737 "Method Using Electrically Re-configurable Gate Array Logical and Device Configured by it"

Patent Reference 2:
Japanese Patent Application No. H7-200508 "Inter-node Combination Method"

Patent Reference 3:
Japanese Patent Application No. S64-26969 "Programmable Accelerator and Method thereof"

Patent reference 1 discloses a system suitable for a variety of objects including simulation, prototyping and an implementation plan, in which electrically re-configurable gate arrays are re-configurably connected to each other, a digital circuit network realized on a reciprocally connected chip by connection re-configuration.

Patent reference 2 discloses a combination method in which a second type node is connected in a specific dimension to first type nodes connected by links in the shape of n-dimensional mesh as combination topology for super-parallel computers.

Patent reference 3 discloses a programmable accelerator that is, a programmable logical simulation device, in which a plurality of substantially the same type processor elements are flexibly connected to each other via switch in such away as to form a cluster, and the processors are programmable.

In the above-mentioned simulation hardware or reference literatures, even if the level sort method targeted by the present invention is used, simulation is executed at a gate level, and a logical simulation device for executing simulation at a logical block level is not realized.

Although the level sort method is theoretically used from the oldest time, as described above, the calculation of all gates is needed at each level. Therefore, the amount of calculation becomes very large, and it is considered to be difficult to manufacture a device of a practically usable scale in order to apply it to the logical simulation of a large-scale digital circuit composed of several ten million or more gates.

Next, in the conventional logical simulator, generally a processor for calculation, that is, evaluation and a processor for communication between processors are separated. Specifically, a processor group for parallel processing and a communication network are separated. Since each communication distance between processors is different, the speed of the entire system degrades.

FIGS. 14 and 15 explain this problem. FIG. 14 shows the configuration of the conventional logical simulation device, in which a processor group and a network are separated.

Simulation includes logical operation, that is, evaluation and update work accompanying the evaluation. In order to realize a high-speed process, evaluation is divided and is performed in parallel. As to the update of the result, since processors are distributed as an evaluation unit for using an evaluation result, a network for a propagation process is needed to notify the other processors of the result.

Specifically, after the evaluation result of each processor is propagated to a processor needing the result, a subsequent operation is started. In this case, the performance of the system depends on two factors of evaluation speed and propagation speed. If the propagation speed is low, the speed of the system degrades as a whole.

FIG. 15 shows the propagation of an evaluation result between processors. In this example, it is assumed that the evaluation result of a processor 0 (PE0) must be propagated to a nearby PE1 and a remote PEn. In the conventional method, the propagation speed of the entire system depends on time needed to propagate the evaluation result to the remote processor PEn. Conventionally, this propagation time problem has been coped with by reducing the influence of this propagation time utilizing pipeline processing, overlapping processing and the like. However, if the number of processors must be widely increased in order to perform a large-scale data process, it is becoming difficult to improve propagation speed because of the physical restriction of hardware.

SUMMARY OF THE INVENTION

It is an object of the present invention to provide a logical simulation device using the same type processor elements capable of executing simulation at a logical block level using the level sort method and performing both evaluation and communication without separating an evaluation processor and a communication processor from each other.

FIG. 1 is a block diagram showing the basic configuration of the present invention. FIG. 1 is a block diagram showing the basic configuration of a simulation device for executing cycle-based logical simulation, using the level sort and compile methods.

In FIG. 1, a logical simulation device 1 comprises a lot of processors 2. Each processor 2 can perform both an evaluation process 3 for executing simulation using a logical block corresponding to one or more gates as an evaluation unit and a communication process 4 with another processor.

In another preferred embodiment of the present invention, the logical block can be composed of one or more gates capable of being wired.

In another preferred embodiment of the present invention, a lot of the processors 2 can be divided into processor groups each composed of a plurality of processors, and a plurality of the processor groups are connected to each other in a tree-shaped hierarchy to constitute a cluster. Simultaneously, a plurality of the clusters can also constitute a logical simulation device.

In this case, a plurality of processors in a processor group can be completely connected to each other. Alternatively, processor groups in the same layer can be completely connected to each other in the lower layer of the tree-shaped hierarchy. Furthermore, alternatively, a processor group in the highest layer of each of a plurality of clusters can be logically connected to a processor group in the highest layer in another cluster.

In another preferred embodiment of the present invention, each processor group can comprise an input/output processor for performing the input/output control of memory data and an external input/output pattern for each processor composing the group. Alternatively, a trace data storage unit for storing the trace data of simulation and an external input signal pattern and a small-capacity data storage unit equivalent to cache memory can be provided for each processor. Furthermore, alternatively, a large-capacity data storage unit equivalent to main storage can be provided for each processor group belonging to the higher-order side of the tree-shape hierarchy.

Furthermore, in another preferred embodiment, the logical simulation device can adopt a distribution type super-parallel architecture by a lot of processors.

As described above, according to the present invention, a logical simulation device comprises a lot of processors capable of performing both an evaluation process for executing simulation and a communication process with another processor, using a logical block as an evaluation unit.

BRIEF DESCRIPTION OF THE DRAWINGS

FIG. 1 is a block diagram showing the basic configuration of the logical simulation device of the present invention.

FIG. 6 shows the logical primitive of the preferred embodiment.

FIG. 7 shows the memory primitive of the preferred embodiment.

FIG. 10 shows the types of an instruction to a processor element.

FIG. 11 is a block diagram showing the configuration of a logical operation unit (LOU).

FIG. 14 shows the configuration of a conventional logical simulation device.

FIG. 15 shows the conventional communication method between processors.

DESCRIPTION OF THE PREFERRED EMBODIMENTS

Firstly, the features in the preferred embodiment of the logical simulation device of the present invention are described. The first feature is the adoption of a distribution type super-parallel architecture using at maximum approximately 87,000 exclusive processors (processor elements (PE)). In the preferred embodiment, by using a distribution type super-parallel architecture, the performance of the system can be improved and the system can be flexibly extended.

The second feature is the use of a simulation method for executing level sort and compile methods at a logical block level. Thus, a large-scale effective simulation capacity and high speed by the reduction of the number of evaluation targets can be realized by using a block composed of a plurality of gates as the evaluation process unit (primitive) of a circuit.

The third feature is a system building method using only one type of processor element (PE). By connecting PEs of the same type to each other according to the same rule, the easy mounting and low cost of the system can be realized in stead of implementing an exclusive processor circuit and an exclusive communication circuit separately. In the modeling of a circuit, one of the processor is assigned by a program for one of the respective operation of either an evaluation process or a communication process, or two operations weighted in an evaluation process or a communication process.

Figure 2:
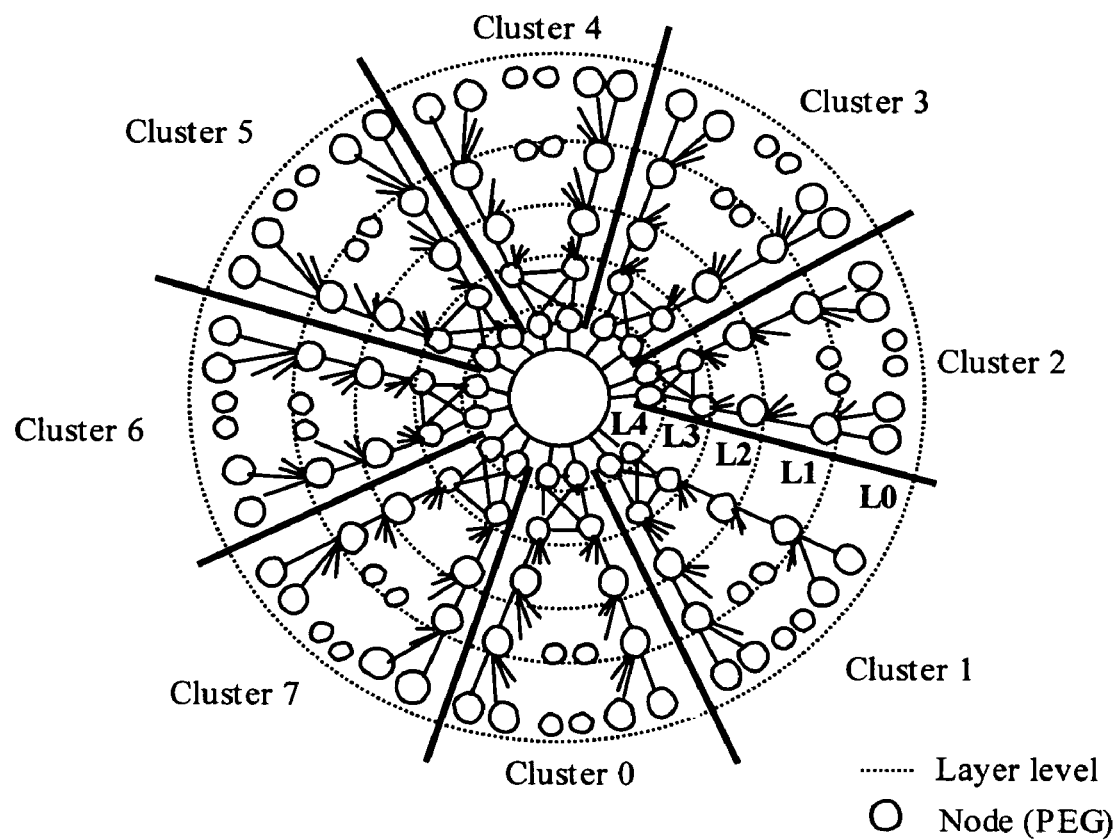
FIG. 2 shows the network configuration of a system composed of eight clusters.

Next, the overall system configuration is described. The system is composed of at maximum eight clusters. FIG. 2 shows the network configuration of a system composed of eight clusters, that is, clusters 0 through 7.

In a super-parallel system composed of several ten thousand processors, how to build network architecture in order to meet the performance and scale conditions of the system is a major issue. From the viewpoint of the easy processor division and performance of a circuit model, a complete inter-processor connection method is the most preferable. However, it is difficult to realize the complete connection of several ten thousand processors because of the physical restriction of a circuit mounting technology. Therefore, in the preferred embodiment, a partially complete connection method using a tree-shaped hierarchical network as its basic architecture is adopted.

The network architecture of the preferred embodiment has the following three features. The first feature is scalable expandability because of the adoption of a tree-shaped hierarchical network.

The second feature is the local optimization of communication between processors by using a partially complete connection method. Generally, in a large-scale circuit, there is the localization of a communication connection based on a hierarchy designed. As a layer becomes low, the number of reciprocal connections tends to increase. Therefore, by minimizing a communication time between processors in a lower layer, for example, by complete connection, performance can be improved.

The third feature is easy network building by using the same type processor elements PE, as described earlier. By enabling one processor to perform both a communication process and an evaluation process, the easy mounting and low cost of the system can be realized.

In FIG. 2, each of the eight clusters has a tree-shaped hierarchical network structure composed of at maximum five layers. A node (mark O) in each layer corresponds to a processor element group (PEG) described later. Four nodes in lower layers are basically connected to each layer around one node in a higher layer. In the highest layer L4, theoretically one PEG in each cluster is connected 1 to 1. This connection is described in detail later.

Figure 3:
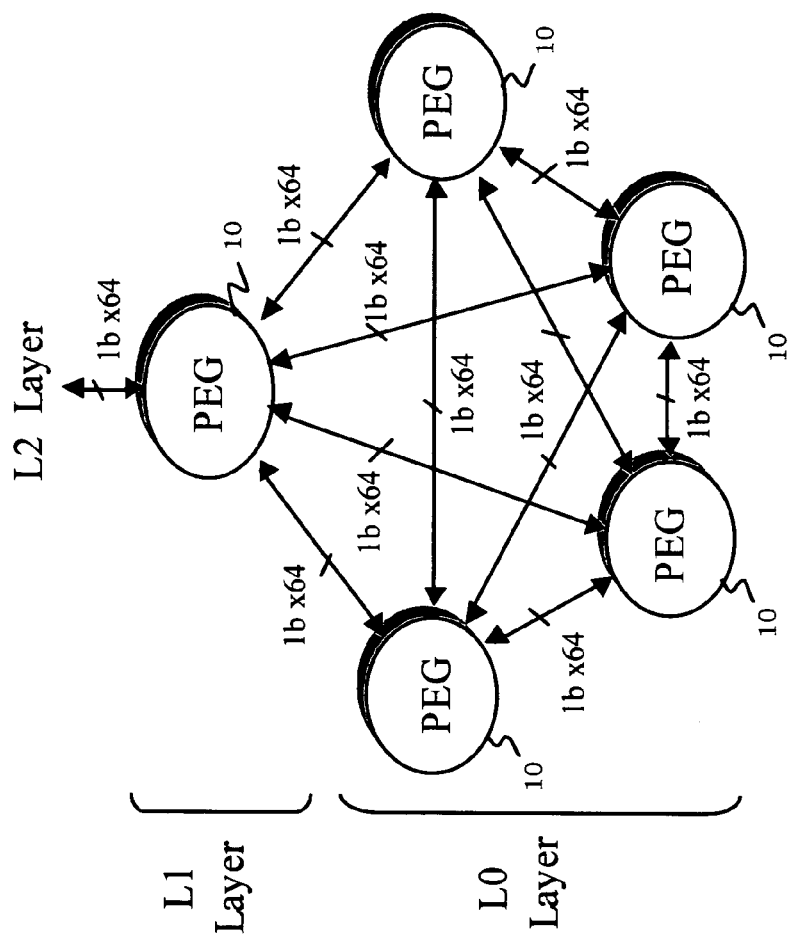
FIG. 3 shows the connection between processor element groups in the lower layer on a cluster.

FIG. 3 shows PEG connection in the lowest layer of a cluster in the preferred embodiment and PEG connection in its immediately higher layer. In this preferred embodiment, nodes in a low layer L0 and ones in a higher layer L1 are partially completely connected to each other for the reason for high-speed communication between processors in a lower layer. Nodes in layer L2 and ones in layer L3 are connected in a tree-shaped hierarchy. Nodes in layer L1 and ones in layer L2 are also connected in a tree-shaped hierarchy. FIG. 3 shows the connection between nodes in layer L0 and connection between each node in the layer L0 and nodes in its immediately higher later L1.

Figure 4:
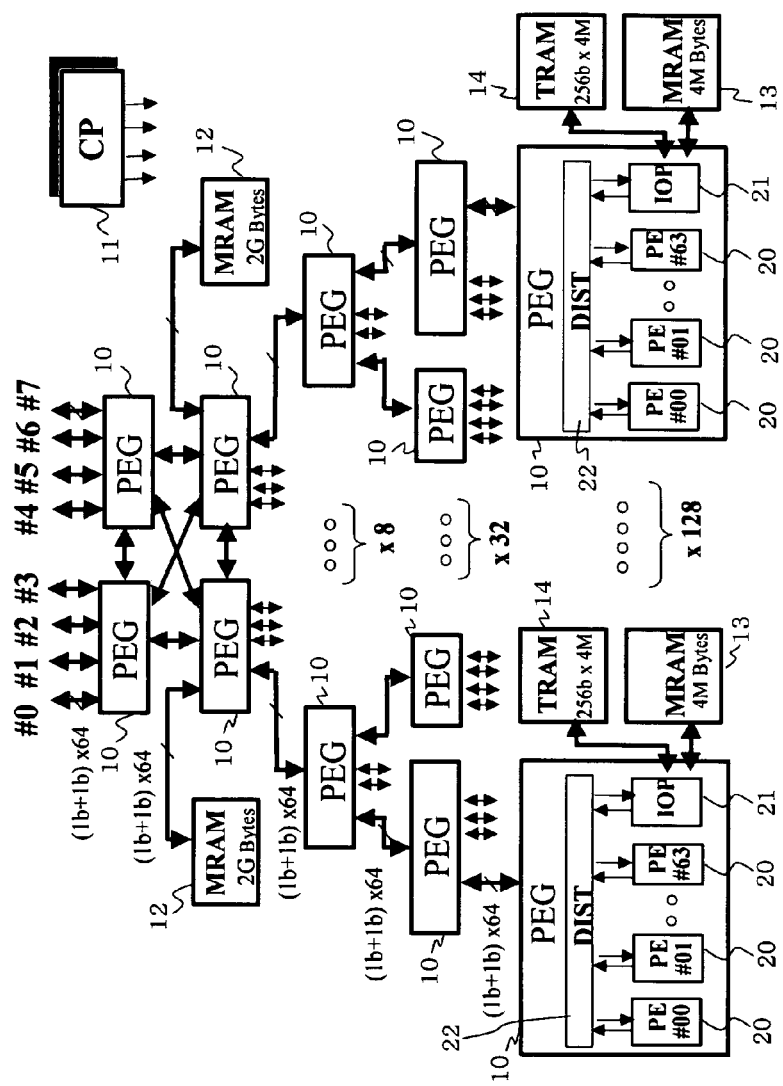
FIG. 4 shows the detailed configuration of a cluster.

FIG. 4 shows the detailed configuration of one cluster shown in FIG. 2. Each cluster comprises approximately 11,000 processors and two types of memory circuits. As described earlier, each cluster has a tree -shaped hierarchical network structure composed of five layers, and one PEG in each cluster is completely connected 1 to 1 in the highest layer.

In FIG. 4, a plurality of processors constitutes a processor element group (PEG). A PEG 10 is composed of 64 processor elements (PE) for performing the evaluation and communication processes of a logical circuit, an input/output processor IOP 21 for evaluating a memory circuit and controlling the writing/reading of an external input/output pattern and a distribution circuit (DIST) 22 for directly connecting all processors in a PEG to each other 1 to 1. Processor elements PEs are grouped in units of 64 because of their physical restriction presuming mounting by 0.18 μm CMOSLSI technology.

As described earlier, the number of reciprocal connections in a hierarchy design tends to increase as a layer becomes low. Therefore, in the present invention, all the processor elements (PE) in a processor element group (PEG) are completely connected to each other to realize high speed data transferring between the processors in a lower side layer.

To the IOP 21 in the PEG 10 constituting the lowest layer, two segments of memory, memory RAM (MRAM) 13 and trace memory (TRAM) 14 are connected. MRAM corresponds to cache memory. MRAM is 4 Mbyte random-access memory storing small-scale data and is disposed for each PEG in the lowest layer in order to transfer memory data to the IOP 21 at high speed.

TRAM stores the trace data of simulation and an external input signal pattern and has capacity of 128 Mbytes. The TRAM 14 is disposed for the PEG 10 in the lowest layer whose main job is an evaluation process, in order to avoid the overflow of a network by locally processing a lot of trace data transmitted from a processor on the system.

In FIG. 4 and, the MRAM 12 is disposed for a PEG in the higher layer like in the second highest layer L3 in FIG. 2. This MRAM 12 corresponds to main storage and can store a large capacity of data. For example, it is 2 Gbyte random-access memory. A large-scale memory circuit is usually positioned in the highest layer in the design stage of a hardware system. Therefore, in order to uniform the transfer distance of memory data of each PE in a cluster, 2 Gbyte MRAM 12 is disposed in the highest layer of each cluster. The MRAM 12 is also directly connected to the IOP 21 in the PEG 10 and is controlled.

As described earlier, in the highest layer of each cluster, theoretically PEGs between clusters are connected to each other 1 to 1. In FIG. 4, although there are two PEGs in the highest layer, this is from the reason of mounting.

In FIG. 4, there are also two PEGs in the second highest layer, and each of the two PEGs between clusters is completely connected to each other. In this case, the other lower PEGs, that is, PEGs in the layers L2 through L0 shown in FIG. 2 between clusters are theoretically connected to each other via one PEG in the highest layer L4.

In FIG. 4, a control processor (CP) 11 controls the entire system composed of at maximum eight clusters to perform synchronous control between processors and the status monitor of the system.

Figure 5:
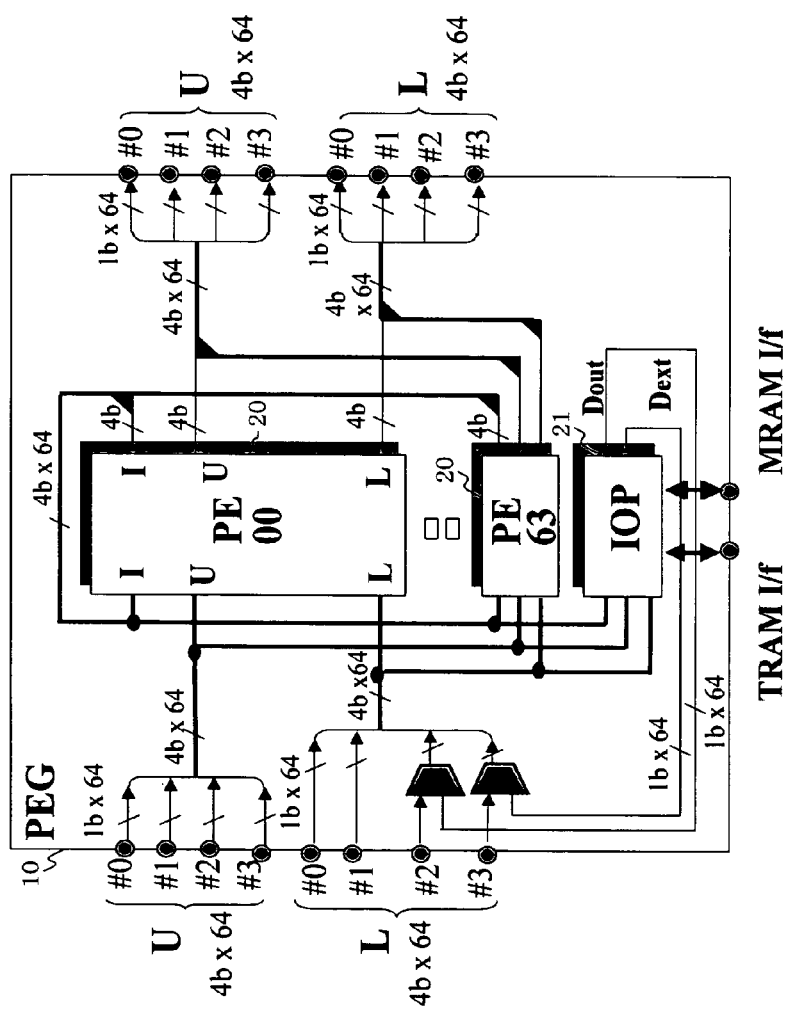
FIG. 5 is a block diagram showing the configuration of a processor element group.

FIG. 5 is a block diagram showing the configuration of one processor element group PEG 10 shown in FIG. 4. As described earlier, the PEG 10 is composed of 64 completely connected PEs 20 and one IOP 21. For the input/output to/from the peg 10, one set of input/output ports U with a width of 4 bits×64 for connection with a PEG in a higher layer and one set of input/output ports L with a width of four bits×64 for connection with a PEG a lower layer are used.

Each PE 20 in the PEG 10 has three sets of input/output ports with a width of 4 bits×64. One port is a connection port for providing the input of each processor with the output of the processor in its own PEG. The U and L ports are connection ports with the PEG 10 in higher and lower layers, respectively.

Next, the operation and configuration of each processor element are described. As described earlier, a processor element is an exclusive processor capable of both the evaluation of a logical circuit model and a communication process between processors. The PE performs an evaluation process using both a logical primitive shown in FIG. 6 and memory primitive as an evaluation unit.

FIG. 6 shows a logical block composed of combination circuits with 16 inputs and four outputs, and this logical block is basically evaluated in one machine cycle. Each PE can store at maximum 64 logical blocks.

FIG. 7 shows a memory primitive equivalent to a memory device of m bits of data (input/output) and n bits of address (input). The memory primitive further has one bit of chip select and one obit write enable as input.

In simulation, a circuit to be detection is expressed as the net list of logical blocks obtained by templating the primitive shown in FIG. 7. A logical block is evaluated by sequentially evaluating each logical block leveled based on the number of logical steps outputted from an external input terminal and a storage device in the ascending order of a level number (level sort method).

The evaluation order of each logical block and the signal transmission order of an evaluation result are expressed as a program using an instruction to a processor (compile method). A programmed circuit model is interpreted and implemented by a processor according to the instruction order of a program.

All PEs in the system operate in synchronization with a start signal transmitted from the control processor CP 11 shown in FIG. 4. Each processor independently operates during a simulation clock, which is described later. This is because in level sort and compile methods, the evaluation order of circuits in one simulation clock is established beforehand when a model is generated and no logical contradiction occurs even if each model operates independently.

Figure 8:
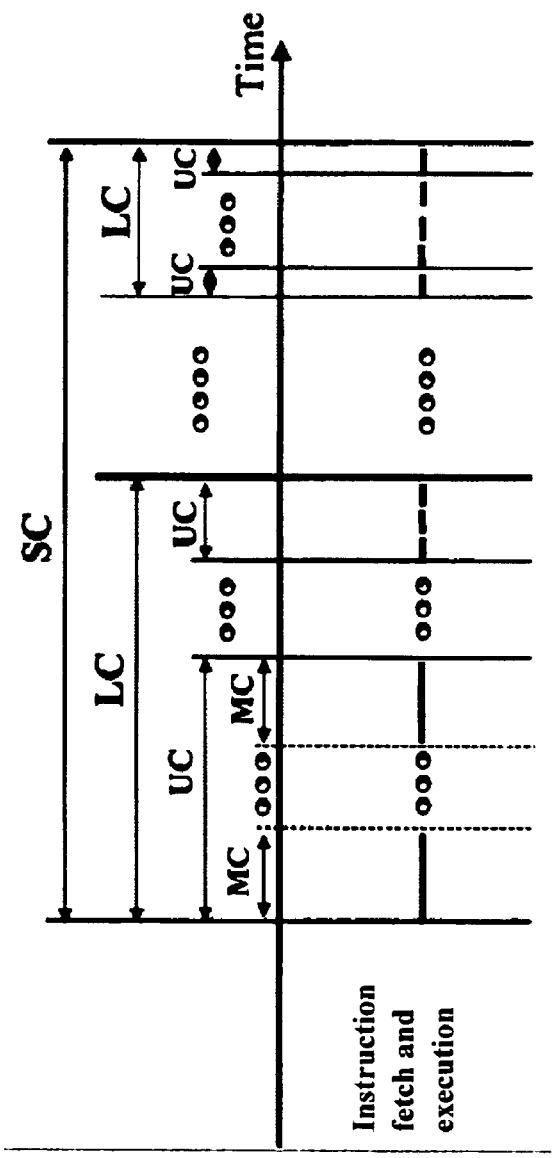
FIG. 8 shows the operation cycle of a processor element.

FIG. 8 shows the operation cycle of a PE. The time of each PE is managed according to four basic cycles. As described earlier, each PE starts a simulation cycle SC according to a start signal issued by a control processor CR. The minimum operation cycle of a PE is a machine cycle (MC) according to the basic clock of the system, and in this preferred embodiment, the system operates as a synchronous circuit based on this machine cycle.

A unit cycle UC is the basic cycle of the system operation, and indicates the execution cycle of one instruction in a PE. Although one UC is basically one MC, it is two or more MCs if a lot of data signals are transferred in one UC. A level cycle LC corresponds to the execution cycle of one level in the level sort method.

For example, if one logical block is evaluated in one level in a specific PE, 1 LC=1 UC. However, if n logical blocks are evaluated in one level, 1 LC=n×UC. The highest-order simulation cycle SC means the execution cycle of one simulation clock and is expressed by the integer times of an LC.

Figure 9:
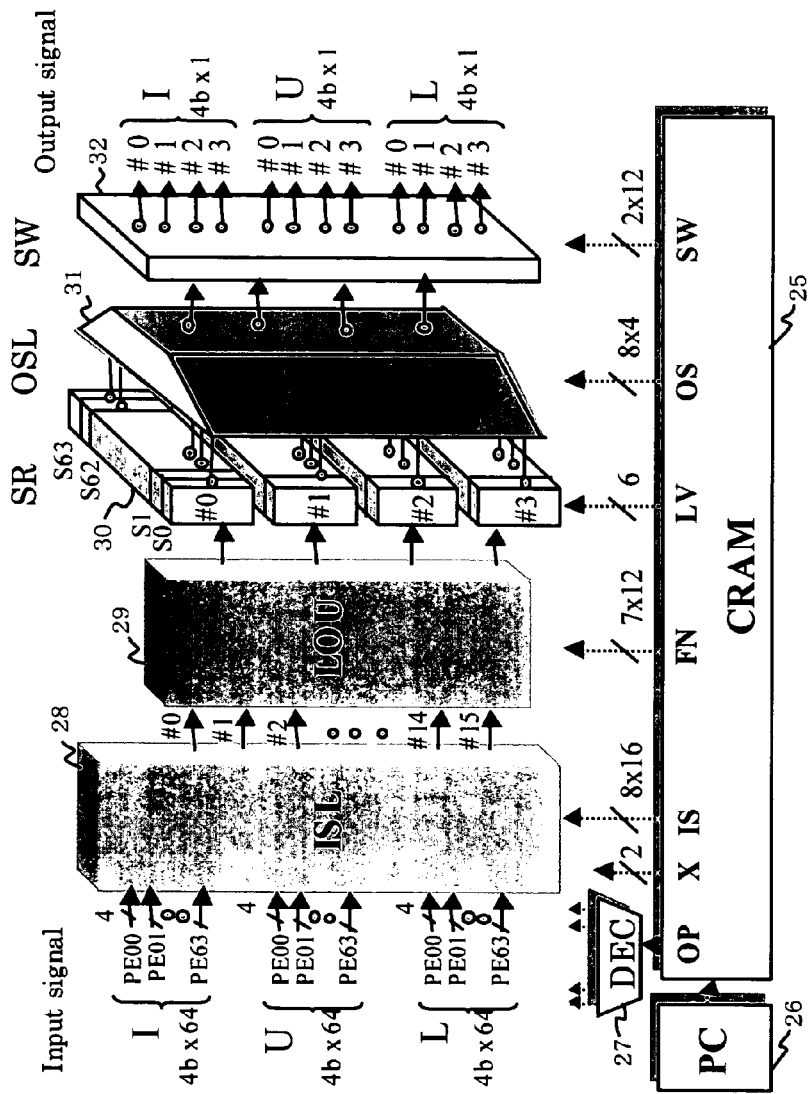
FIG. 9 shows the detailed configuration of a processor element.

FIG. 9 is a block diagram showing the detailed configuration of a PE. The execution of simulation is controlled by a control program stored in control memory CRAM (control RAM) 25. The control program corresponds to a net list of logical blocks of a circuit to be detected and an equivalent circuit model in which the execution order of the logical blocks is expressed by an instruction word to a PE. The evaluation process of one logical block can be basically expressed by one PE instruction.

A CRAM 25 is memory of 287 bits×64 words. Since a CRAM capable of storing at maximum up to 64 PE instructions of 287 bits of instruction length usually has 20 or less than 30 gate steps of a flip-flop combination circuit, it can afford to handle at maximum up to 64 steps in a logical block level.

The number of logical block steps in one simulation cycle can be extended at maximum up to 256 by logically connecting CRAMs 25 between PEs. Each instruction in the CRAM 25 is read and executed according to an address indicated by a program counter PC in a PE.

An instruction word stored in the CRAM 25 is composed of seven control fields. The seven control fields are two control fields (OP and X) for time management and condition monitor, and five control fields (IS, FN, LV, OS and SW) for data path control.

The OP field controls the operation of the CRAM 25. The OP field is composed of a three-bit op code indicating an instruction type and an eight-bit operand as control data. The op code is the control code of a program counter PC 26. The op code is interpreted by a decoder 27 and is used to control the PC 26. The X field is a two-bit flag indicating trace data and a monitor condition signal.

FIG. 10 shows the types of an instruction to a PE. In this preferred embodiment, six types of basic instructions shown in FIG. 10 are supported in order to efficiently use the limited address space of the CRAM 25. For example, if a plurality of PEs performs a process of one simulation cycle SC in the level sort method, the simulation cycle SC is determined by the number of level cycles corresponding to a PE evaluating the maximum number of logical primitives of all the PEs. Each of the other primitives enters into an idle status after the evaluation of an assigned logical primitive is completed, and executes a nop instruction or a wait instruction. Then, it completes one SC.

As described earlier, an input signal to a PE is composed of three signal groups of I, U and L. Each signal group has a width of four bits×64. In this case, 64 corresponds to the number of connection destination PEs. The I group includes input signals from 64 processors in a processor group (PEG) to which the PE belongs, and U and L groups include input signals from the other PEs.

An input selector ISL 28 is a circuit for selecting 16 output signals to be provided to a logical operation unit LOU 29. The ISL is theoretically a 768-to-16 selector unit, and is composed of 16 192-to-1 selectors disposed in the shape of an array with four rows×four columns. To each of the four selectors of each column, the output lines of the same number from 192 PEs are connected. In order to symmetrize the number of inputs/outputs of each PE, among 192×4 bit inputs, 64×4 bit inputs and the remaining 128×four bit inputs are inputted from PEs in the same group and PEs in the other groups, respectively. The ISL 28 is selected and controlled by a 8 bits×16 IS field signal.

The logical operation unit LOU 29 a circuit for evaluating a logical block. The logical operation function of the LOU 29 is realized by combining the respective logical function of each basic operation circuits (LE) which constitute the LOU 29, in accordance with the gate configuration of a logical block to be evaluated. The configurations of the LOU and LE are shown in FIGS. 11 and 12, respectively.

In FIG. 11, the LOU 29 is composed of 12 LEs. The LOU 29 adopts a circuit configuration of three steps of 4 LEs from the viewpoint of a target machine cycle and mapping efficiency to the logical primitive of a circuit to be detected.

Figure 12:
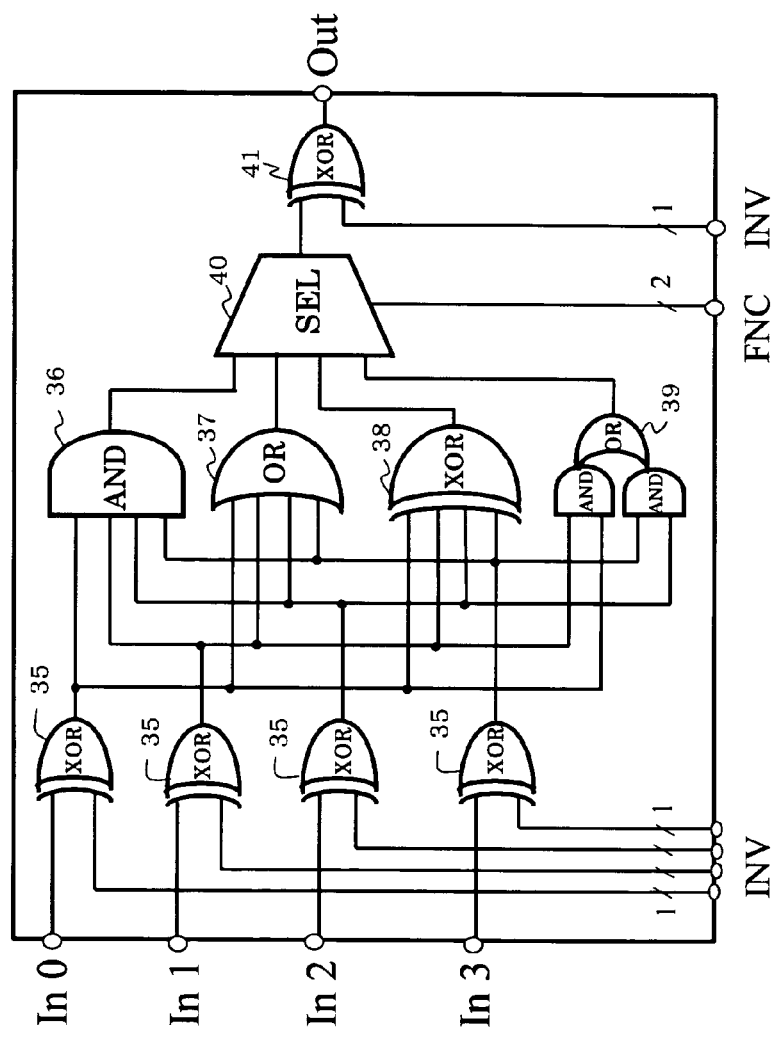
FIG. 12 shows an example of basic operation circuit (LE).

In FIG. 12, each LE is provided with four types of basic circuits of one AND circuit 36 with four inputs, one OR circuit 37, one XOR circuit 38 and one AND/OR circuit 39, and one of the four basic circuits is selected by a selector 40.

In order to improve the mapping efficiency to a logical primitive, XOR circuits 35 and 41 are disposed at input and output ends, respectively, of each LE.

The logical operation unit LOU 29 evaluates a combination circuit with at maximum 12 gates composed of gates with four inputs in one machine cycle. Its logical function is controlled by a 7 bits×12 FN field signal from the CRAM 25.

The logical function of the LE shown in FIG. 12 is determined by INV and FNC signals. The INV signal controls the logical inversion function of the XOR 35 and 41, and the FNC signal is used as a signal for selecting one of the four basic circuits.

The status value register SR 30 show in FIG. 9 stores the output signal value of a logical block evaluated by the logical operation unit LOU 29. One SR 30 is a register with 64 bits×one word, four SRs 30 are installed in one-to-one accordance with each output of the LOU 29. The output value of the LOU 29 is simultaneously written into four SRs 30 by the same bit address. The data of each SR 30 can be independently read using an arbitrary address. The SR 30 stores the output value of a logical block in all level cycles during one simulation cycle. A writing address into the SR 30 is provided by a six-bit LU field signal from the CRAM 25.

An output selector OSL 31 reads the output value of the evaluation of a logical block written in the four status value registers 30 and finalizes the output value of a PE. The OSL 31 is theoretically composed of 256-to-1 selector circuits and can select an arbitrary address with 64 bits×4 address space in which the respective addresses of the four status value registers are collected to one. An access function to the entire address space is provided to minimize waiting time caused by the reading competition of a specific address in the SR 30. The operation of the OSL 31 is controlled by an 8 bits×4 bits OS field signal from the CRAM 25.

An output switch SW 32 is a circuit for connecting the output terminal of the OSL 31 to the output terminal of a PE connected to a destination PE for transferring a data signal read by the output selector OSL 31 to a destination PE. In other words, since a connection between PEs is fixed by wiring, a path is formed by connecting the four output terminals of the OSL 31 to proper one of 12 output terminals according to the destination of the data signal. The output signal wires of a PE are divided into three groups composed of four bits, in accordance with each connection destination PE. The respective definitions of the groups I, U and L are the same as those of the input signals. The SW 32 is controlled to form a 4-to-12 connection path by a 2 bits×12 SW field signal from the CRAM 25.

Figure 13:
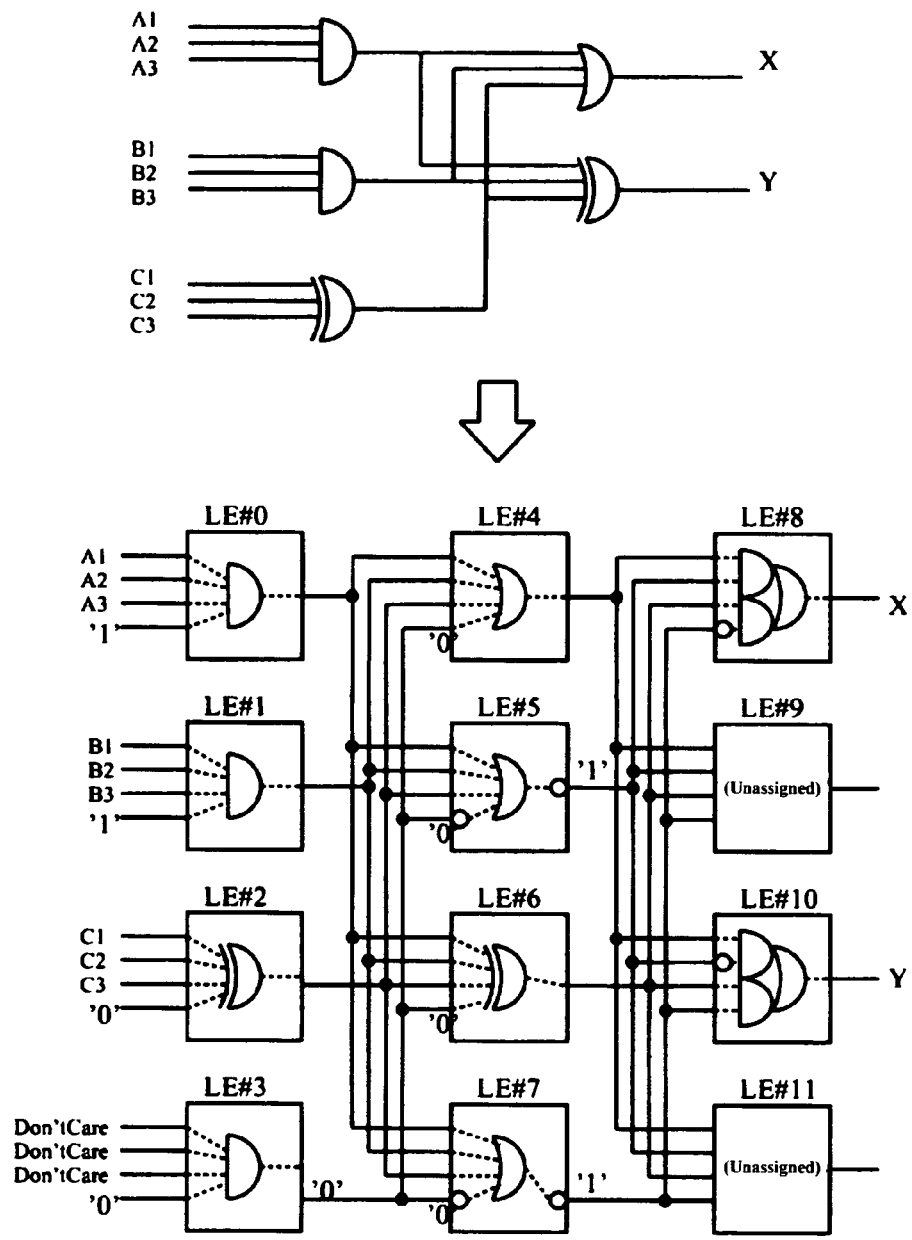
FIG. 13 shows an example of the mapping of logical circuits shown in FIGS. 11 and 12.

FIG. 13 shows an example of the circuit mapping of the logical operation unit LOU 29 shown in FIGS. 11 and 12. Its upper drawing shows a mapping target circuit, and its lower drawing shows the result of mapping it into the 12 basic operation circuit LEs shown in FIG. 11. In FIG. 13, LE#3 in the first step is used to output "0" to all the LEs in the second steps, LE#5 and LE#7 in the second step are used to output "1" to each of all the LEs in the third step and LE#8 and LE#10 in the third step substantially pass data through them.

So far the preferred embodiments of the present invention have been described. However, for example, each control bit outputted from the CRAM 25 shown in FIG. 9 shows only one preferred embodiment, and in the configuration of operation element LE shown in FIG. 12 too, an input unit can further comprise a selector. Alternatively, the type of the basic circuit can be modified.

As described in detail above, according to the present invention, by using level sort and compile methods, a device with a scale such that the logical simulation of a large-scale digital circuit can be executed in a logical block level and can be easily used can be provided.

The speed of the entire system can be improved by grouping the same type processor elements capable of executing both evaluation and communication without separating an evaluation processor from a communication processor, and connecting a plurality of such groups to each other in the tree-shape hierarchy.

The present invention can be used in all industries which require a large-scale and high-speed logical verification and logical designing in digital system equipment.

What is claimed is:

1. A logical simulation device executing cycle-based logical simulation using level sort and compile methods, comprising:
   a first plurality of processors for performing both an evaluation process of executing simulation of logical blocks using logical blocks corresponding to one or more gates as an evaluation unit, and a communication process with a remainder of the first plurality of processors;
   a small-capacity data storage unit equivalent to cache memory, and wherein
      each of the first plurality of said processors are divided into processor groups composed of a second plurality of processors,
      a plurality of the processor groups are connected to each other in a tree-shape hierarchy to constitute one cluster, and
      said logical simulation device is composed of a plurality of the clusters; and a trace data storage unit for storing trace data of the cycle-based logical simulation and an external input signal pattern according to each processor group belonging to a lower side of the tree-shaped hierarchy.

2. The logical simulation device according to claim 1, wherein
   the logical block is composed of one or more gates capable of being hardwired.

3. The logical simulation device according to claim 1, wherein
   a plurality of processors in the processor groups are completely connected to each other.

4. The logical simulation device according to claim 1, wherein
   processor groups in the same layer can be completely connected to each other in a lower layer of the tree-shaped hierarchy.

5. The logical simulation device according to claim 1, wherein
   processor group in a highest layer of the tree-shaped hierarchy in each of the plurality of clusters are completely connected to processor groups in a highest layer of the tree-shaped hierarchy in each of the other clusters.

6. The logical simulation device according to claim 1, wherein
   each of the processor groups is provided with an input/output processor for performing input/output control of memory data and an external input/output pattern in accordance with each processor constituting the group.

7. The logical simulation device according to claim 1, further comprising
   a large-capacity data storage unit equivalent to main storage according to each processor group belonging to the upper side of the tree-shaped hierarchy.

8. The logical simulation device according to claim 1, wherein
   a distribution type super-parallel architecture by a plurality of the processors is adopted.

9. A logical simulation method for executing cycle-based logical simulation using level sort and compile methods, comprising using a plurality of processors for performing both an evaluation process of executing simulation of logical blocks using logical blocks corresponding to one or more gates as an evaluation unit, and a communication process with a remainder of the first plurality of processors;

a small-capacity data storage unit equivalent to cache memory, and wherein each of the first plurality of said processors are divided into processor groups composed of a second plurality of processors, a plurality of the processor groups are connected to each other in a tree-shape hierarchy to constitute one cluster, and said logical simulation device is composed of a plurality of the clusters; and storing trace data of the cycle-based logical simulation and an external input signal pattern according to each processor group belonging to a lower side of the tree-shaped hierarchy.

* * * * *